United States Patent
Lin et al.

(10) Patent No.: US 10,084,135 B2
(45) Date of Patent: Sep. 25, 2018

(54) ILLUMINATION DEVICE AND METHOD OF FABRICATING AN ILLUMINATION DEVICE

(71) Applicant: Industrial Technology Research Institute, Hsinchu (TW)

(72) Inventors: Hsuan-Yu Lin, Changhua County (TW); Hsin-Chu Chen, Miaoli County (TW); Wen-Hong Liu, Taichung (TW); Chao-Feng Sung, Hsinchu (TW); Chun-Ting Liu, Hsinchu County (TW); Je-Ping Hu, Hsinchu (TW); Wen-Yung Yeh, Hsinchu County (TW)

(73) Assignee: Industrial Technology Research Institute, Hsinchu (TW)

( * ) Notice: Subject to any disclaimer, the term of this patent is extended or adjusted under 35 U.S.C. 154(b) by 0 days.

(21) Appl. No.: 14/949,905

(22) Filed: Nov. 24, 2015

(65) Prior Publication Data
US 2016/0155945 A1    Jun. 2, 2016

Related U.S. Application Data

(60) Provisional application No. 62/085,324, filed on Nov. 27, 2014.

(51) Int. Cl.
*H01L 51/52* (2006.01)
*H01L 51/00* (2006.01)
(Continued)

(52) U.S. Cl.
CPC ...... *H01L 51/0024* (2013.01); *H01L 51/5203* (2013.01); *H01L 51/5237* (2013.01);
(Continued)

(58) Field of Classification Search
CPC .......... H01L 51/5237–51/5259; H01L 33/483; H01L 33/486; H01L 27/3293; H01R 13/6205; F21V 21/096
See application file for complete search history.

(56) References Cited

U.S. PATENT DOCUMENTS

| 6,561,666 B2 * | 5/2003 | Park ................... H01L 51/5203 257/433 |
| 6,850,006 B2 | 2/2005 | Kim et al. |

(Continued)

FOREIGN PATENT DOCUMENTS

| CN | 103154857 | 6/2013 |
| CN | 103226917 | 7/2013 |

(Continued)

OTHER PUBLICATIONS

"Office Action of Taiwan Counterpart Application", dated Jun. 1, 2016, p. 1-p. 8.

(Continued)

*Primary Examiner* — Bryan Junge
(74) *Attorney, Agent, or Firm* — JCIPRNET

(57) ABSTRACT

An illumination device includes a substrate, a light emitting structure, a sealant, and a laminating board is provided. The light emitting structure includes a first electrode layer, a light emitting layer and a second electrode layer stacked on the substrate sequentially. The sealant covers the light emitting structure. The laminating board is attached to the substrate. The sealant is located between the laminating board and the substrate. The laminating board includes a carrier body, a metal layer and a plurality of pads. The metal layer is exposed at a first surface of the carrier body, is in contact with the sealant and shields an area of the light emitting layer of the light emitting structure. The pads are exposed at the first surface of the carrier body and electrically connected to the first electrode layer and the second electrode layer. The metal layer is electrically isolated from the pads.

22 Claims, 14 Drawing Sheets

(51) Int. Cl.
*H01R 12/70* (2011.01)
*H01R 13/62* (2006.01)
*H01L 51/56* (2006.01)

(52) U.S. Cl.
CPC ..... *H01L 51/5246* (2013.01); *H01R 12/7076* (2013.01); *H01R 13/6205* (2013.01); *H01L 51/56* (2013.01)

(56) References Cited

U.S. PATENT DOCUMENTS

| | | | |
|---|---|---|---|
| 6,867,539 B1* | 3/2005 | McCormick | H01L 51/5253 257/40 |
| 8,686,635 B2 | 4/2014 | Choi | |
| 8,836,204 B2* | 9/2014 | Kagotani | B32B 17/10036 313/45 |
| 2003/0062829 A1* | 4/2003 | Heimgartner | H01L 27/3276 313/506 |
| 2004/0251826 A1* | 12/2004 | Schlenker | H01L 51/5243 313/512 |
| 2005/0110396 A1* | 5/2005 | Cok | H01L 51/529 313/503 |
| 2005/0227387 A1* | 10/2005 | Yokajty | H01L 51/5246 438/22 |
| 2006/0220548 A1* | 10/2006 | Menda | H01L 51/5256 313/512 |
| 2009/0189511 A1* | 7/2009 | Yamazaki | G01N 33/497 313/498 |
| 2010/0213833 A1 | 8/2010 | Kawachi et al. | |
| 2011/0156084 A1 | 6/2011 | Choi et al. | |
| 2011/0241528 A1* | 10/2011 | Choi | H01L 51/524 313/317 |
| 2012/0025700 A1* | 2/2012 | Ryu | H01L 27/3276 313/512 |
| 2012/0061131 A1* | 3/2012 | Lee | B32B 15/08 174/257 |
| 2012/0146061 A1* | 6/2012 | Nam | H01L 27/3276 257/88 |
| 2012/0146487 A1* | 6/2012 | Kim | H01L 27/3276 313/504 |
| 2012/0153814 A1* | 6/2012 | Lee | H01L 51/524 313/504 |
| 2012/0248466 A1* | 10/2012 | Park | H01L 27/3276 257/88 |
| 2013/0010482 A1* | 1/2013 | Choi | H01L 51/5212 362/398 |
| 2013/0126858 A1* | 5/2013 | Boerner | H01L 51/5237 257/40 |
| 2013/0170238 A1 | 7/2013 | Diekmann et al. | |
| 2013/0270580 A1* | 10/2013 | Choi | H01L 51/524 257/82 |
| 2014/0002113 A1 | 1/2014 | Schediwy et al. | |
| 2015/0054402 A1 | 2/2015 | Richter et al. | |
| 2015/0115237 A1 | 4/2015 | Diekmann et al. | |
| 2016/0087237 A1* | 3/2016 | Oh | H01L 51/5203 257/40 |

FOREIGN PATENT DOCUMENTS

| | | |
|---|---|---|
| CN | 104051357 | 9/2014 |
| TW | 201108853 | 3/2011 |
| TW | 201210104 | 3/2012 |
| TW | 201225728 | 6/2012 |
| TW | 201227680 | 7/2012 |
| TW | 201229623 | 7/2012 |
| TW | I373832 | 10/2012 |
| TW | 201436075 | 9/2014 |

OTHER PUBLICATIONS

A. P. Ghosh, et al., "Thin-film encapsulation of organic light-emitting devices," Applied Physics Letters, vol. 86, May 2005, pp. 223503-1-223503-3.

Sang-Hee Ko Park, et al., "Ultra Thin Film Encapsulation of Organic Light Emitting Diode on a Plastic Substrate," ETRI Journal, vol. 27, No. 5, Oct. 2005, pp. 545-550.

Jongwoon Park, et al., "Heat transfer property of thin-film encapsulation for OLEDs," Organic Electronics, vol. 12, Feb. 2011, pp. 227-233.

Hyokyun Ham, et al., "Thermal and barrier properties of liquid getter-filled encapsulations for OLEDs," Organic Electronics, vol. 12, Dec. 2011, pp. 2174-2179.

Katsuyuki Morii, et al., "Encapsulation-free hybrid organic-inorganic light-emitting diodes," Applied Physics Letters, vol. 89, Oct. 2006, pp. 183510-1-183510-3.

\* cited by examiner

ILLUMINATION DEVICE AND METHOD OF FABRICATING AN ILLUMINATION DEVICE

CROSS-REFERENCE TO RELATED APPLICATION

This application claims the priority benefits of U.S. provisional application Ser. No. 62/085,324, filed on Nov. 27, 2014. The entirety of the above-mentioned patent application is hereby incorporated by reference herein and made a part of this specification.

BACKGROUND OF THE DISCLOSURE

1. Field of the Disclosure

The present disclosure generally relates to an illumination device and method of fabricating the same.

2. Description of Related Art

Organic light emitting material can transfer electric energy to photo energy with high conversion efficiency. A light emitting structure formed by sandwiching the organic light emitting material between two electrode layers offers a lot of advantages, such as wide viewing angle, fast response speed, less power consumption, full color, low cost and simple fabricating process. Therefore, the usage of the organic light emitting material has become significant. For example, the light emitting structures utilizing the organic light emitting material are applied to illumination devices, display panels and so on.

In the application of the illumination device, the light emitting material needs be completely sealed for preventing from the external gas and water. Therefore, before bonding the light emitting structure to a circuit board via an anisotropic conductive film (ACF), the fabrication of the illumination device further includes the step of sealing the light emitting structure, which complicates the fabrication and increase the fabrication time and cost. Particularly, the required fabrication temperature of bonding the light emitting structure to the circuit board via the ACF usually is 120° C. to 170° C. which may deteriorate the organic light emitting material.

SUMMARY OF THE DISCLOSURE

The disclosure is directed to an illumination device with a simple structure and a simple method of fabricating an illumination device with the simple structure.

In one embodiment, an illumination device includes a substrate, a light emitting structure, a sealant, and a laminating board is provided. The light emitting structure includes a first electrode layer, a light emitting structure and a second electrode stacked on the substrate in sequence. The sealant is disposed on the substrate and covers the light emitting structure. The laminating board is attached to the substrate. The sealant is located between the laminating board and the substrate. The laminating board includes a carrier body, a metal layer and a plurality of pads. The metal layer is exposed at a first surface of the carrier body, is in contact with the sealant and shields an area of the light emitting layer of the light emitting structure. The pads are exposed at the first surface of the carrier body and electrically connected to the first electrode layer and the second electrode layer. The metal layer is electrically isolated from the pads.

In one embodiment of the disclosure, a method of fabricating an illumination device includes attaching a laminating board to a substrate by a sealant while the sealant is located between the substrate and the laminating board. The laminating board includes a carrier body, a metal layer, and a plurality of pads. The pads are electrically isolated from the metal layer and the sealant is in contact with the metal layer. A light emitting structure including a first electrode layer, a light emitting layer and a second electrode layer sequentially stacked on the substrate is encapsulated between the substrate and the laminating board. The sealant covers the light emitting structure, and the metal layer of the laminating board shields an area of the light emitting layer of the light emitting structure.

In light of the foregoing, the illumination device according to an embodiment of the disclosure includes a laminating board serving as a circuit board as well as a barrier so that the fabrication of the illumination device is simplified.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the disclosure.

DESCRIPTION OF THE EMBODIMENTS

Figure 1A:
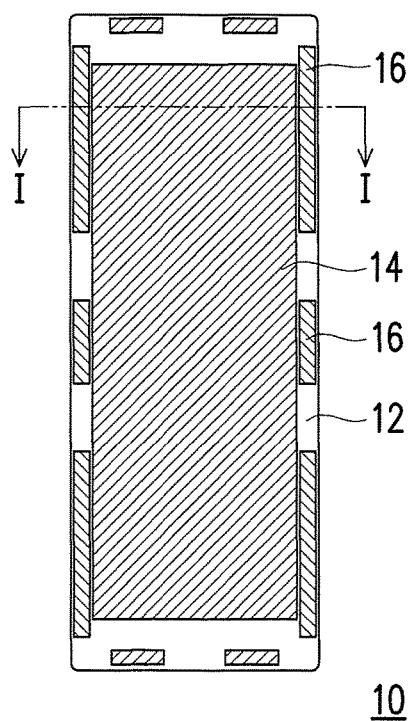
FIG. 1A schematically illustrates a step of fabricating an illumination device according to one embodiment of the disclosure.

Reference will now be made in detail to the present preferred embodiments of the disclosure, examples of which are illustrated in the accompanying drawings. Wherever possible, the same reference numbers are used in the drawings and the description to refer to the same or like parts.

Figure 1B:
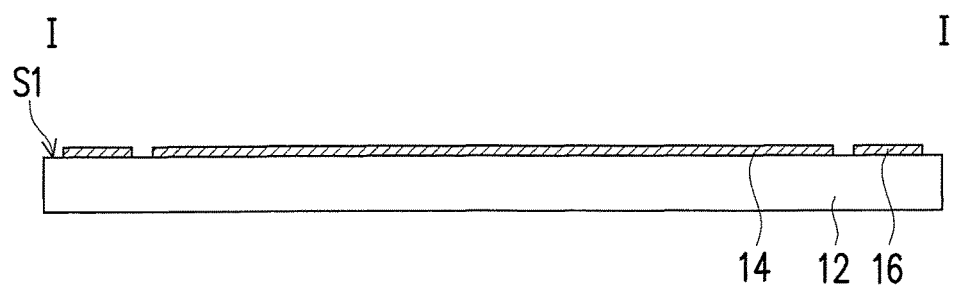
FIG. 1B schematically shows a cross section taken along line I-I in FIG. 1A.

FIG. 1A schematically illustrates a step of fabricating an illumination device according to one embodiment of the disclosure and FIG. 1B schematically shows a cross section taken along line I-I in FIG. 1A. Referring to FIG. 1A and FIG. 1B, a laminating board 10 includes a carrier body 12, a metal layer 14 and a plurality of pads 16. The metal layer 14 and the pads 16 are formed in the carrier body 12 and are exposed at a first surface S1 of the carrier body 12. As shown in FIGS. 1A and 1B, the metal layer 14 is exposed at the central part of the first surface S1 and the pads 16 surrounds the metal layer 14 at the periphery of the first surface S1. In addition, the metal layer 14 is physically and electrically isolated from the pads 16, and each of the pads 16 can be electrically isolated from another pad 16.

The carrier body 12 can be made of polymer material. The metal layer 14 and the pads 16 can be formed by laminating plural conductive layers, such as metal layers, with the polymer material. In one instance, the laminating board 10 can be a flexible circuit board and the thickness of the whole laminating board 10 can be 0.2 mm to 0.4 mm. In addition, the material of the metal layer 14 and the pads 16 can include Cu or the like and the thickness of the metal layer 14 can be 100 μm, such that the metal layer 14 can serve as a barrier for blocking gas and water.

Figure 2A:
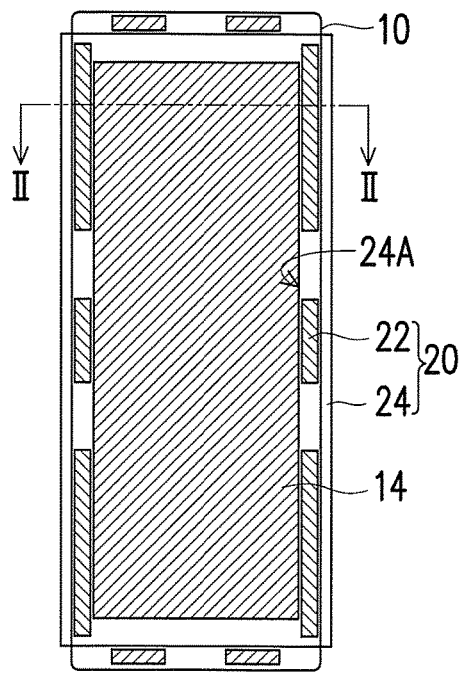
FIG. 2A schematically illustrates a step of fabricating an illumination device according to one embodiment of the disclosure.
Figure 2B:
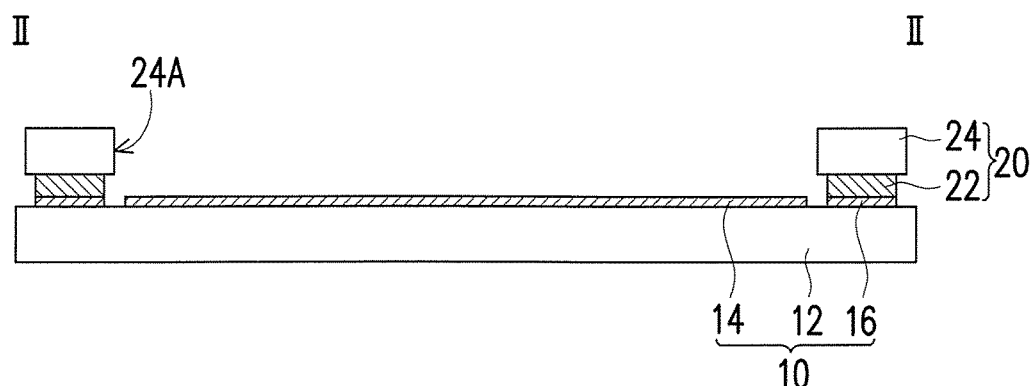
FIG. 2B schematically shows a cross section taken along line II-II in FIG. 2A.

FIG. 2A schematically illustrates a step of fabricating an illumination device according to one embodiment of the disclosure and FIG. 2B schematically shows a cross section taken along line II-II in FIG. 2A. Referring to FIG. 2A and FIG. 2B, a conductive film 20 is attached onto the laminating board 10. The conductive film 20 includes a plurality of conductors 22 disposed on a releasing layer 24 and the conductors 22 are located between the releasing layer 24 and the laminating board 10. In the present embodiment, the conductors 22 are connected and in contact with the pads 16 respectively and the releasing layer 24 has an opening 24A exposing the area of the metal layer 14. In addition, the conductors 22 are made of conductive adhesive material with the functions of adhering and electrical conduction and the conductors 22 can be a conductive double sided adhesive. Therefore, the conductors 22 can be attached onto the pads 16 without an additional treatment such as heating treatment. In one embodiment, the thickness of the conductors 22 can be 30 μm to 50 μm. In an example, the conductors 22 can be consist of a resin matrix, a plurality of conductive particles, and additives, wherein the conductive particles are dispersed in the resin matrix. The material of the resin can be epoxy resin, acrylic resin, polyurethane or the like. The conductive particles can be powder particles of the metal materials such as Au, Ag, Cu, Al, Zn, Fe, Ni or the like, graphite particles, or particles of conductive compound. In addition, the additives can include dispersant agents, assistants or the like.

Figure 3A:
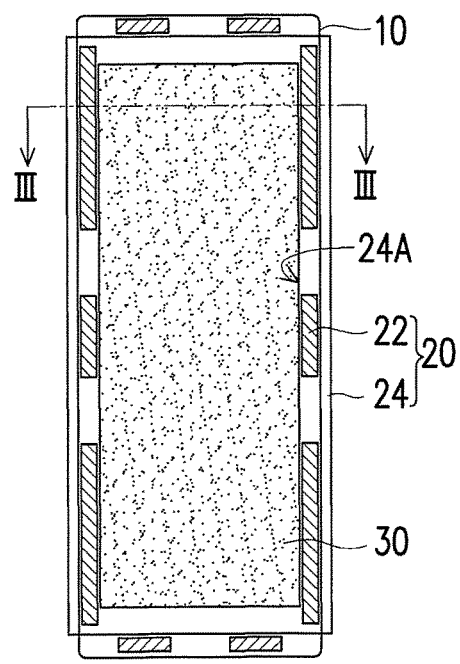
FIG. 3A schematically illustrates a step of fabricating an illumination device according to one embodiment of the disclosure.
Figure 3B:
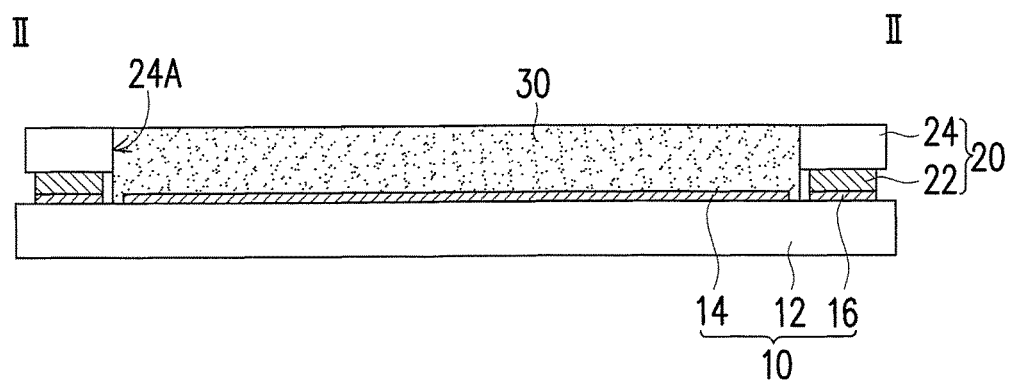
FIG. 3B schematically shows a cross section taken along line III-III in FIG. 3A.

FIG. 3A schematically illustrates a step of fabricating an illumination device according to one embodiment of the disclosure and FIG. 3B schematically shows a cross section taken along line in FIG. 3A. Referring to FIG. 3A and FIG. 3B, a sealant 30 is formed on the laminating board 10, in which the sealant 30 covers the metal layer 14 that is exposed by the opening 24A of the releasing layer 24. The sealant 30 can be made of curable sealing material, such as epoxy resin, acrylic resin, polyurethane or the like and not yet cured in the current step. Specifically, the sealant 30 can be applied on the laminating board 10 through dropping a sealant material on the exposed metal layer 14, coating a sealant material on the exposed metal layer 14, or the like. The sealant material may exceed the area of the exposed metal layer 14 and partially coated on the releasing layer 24.

Figure 4A:
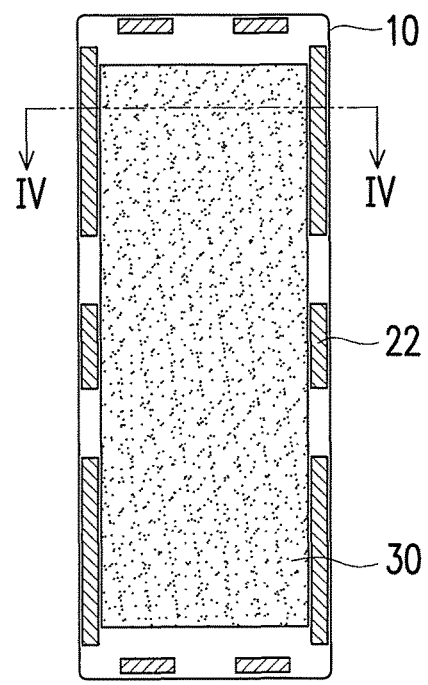
FIG. 4A schematically illustrates a step of fabricating an illumination device according to one embodiment of the disclosure.
Figure 4B:
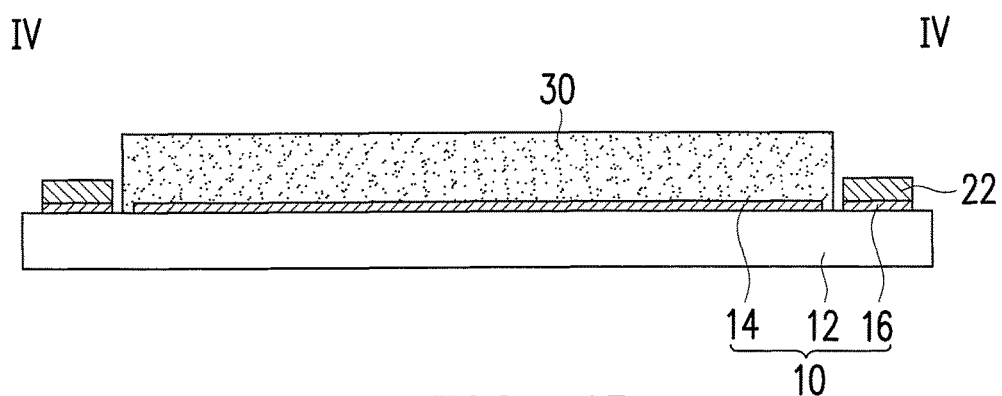
FIG. 4B schematically shows a cross section taken along line IV-IV in FIG. 4A.

FIG. 4A schematically illustrates a step of fabricating an illumination device according to one embodiment of the disclosure and FIG. 4B schematically shows a cross section taken along line IV-IV in FIG. 4A. Referring to FIG. 4A and FIG. 4B, the releasing layer 24 of the conductive film 20 is removed and the conductors 22 remain on the laminating board 10 so that the conductors 22 and the uncured sealant 30 on the metal layer 14 are exposed at the side of the first surface S1 of the carrier body 12 of the laminating board 10. In one embodiment, if the sealant material exceeds the area of the metal layer 14 and is partially coated on the releasing layer 24 shown in FIG. 3B, the portion of the sealant material on the releasing layer 24 can be removed with along the releasing layer 24 in the current step.

Figure 5A:
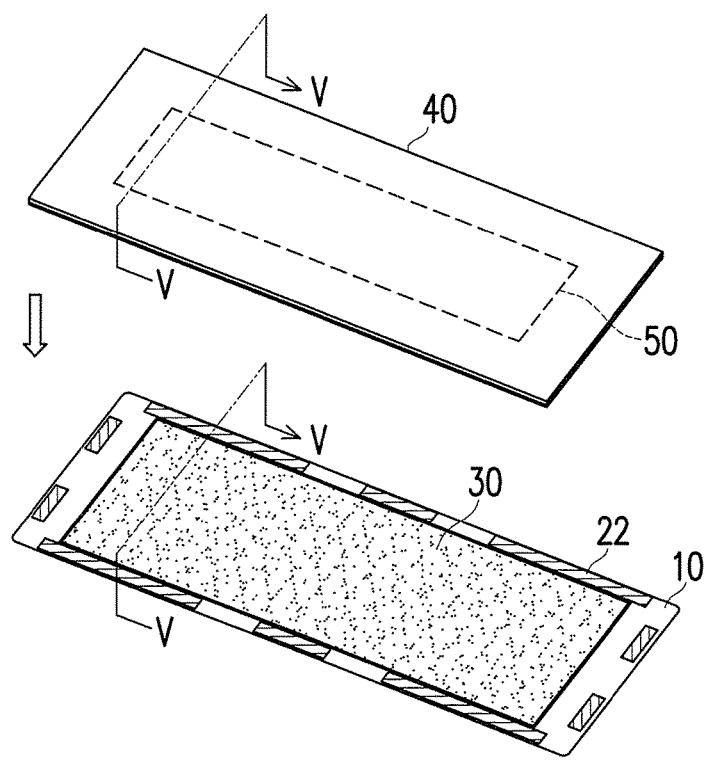
FIG. 5A schematically illustrates a step of fabricating an illumination device according to one embodiment of the disclosure.
Figure 5B:
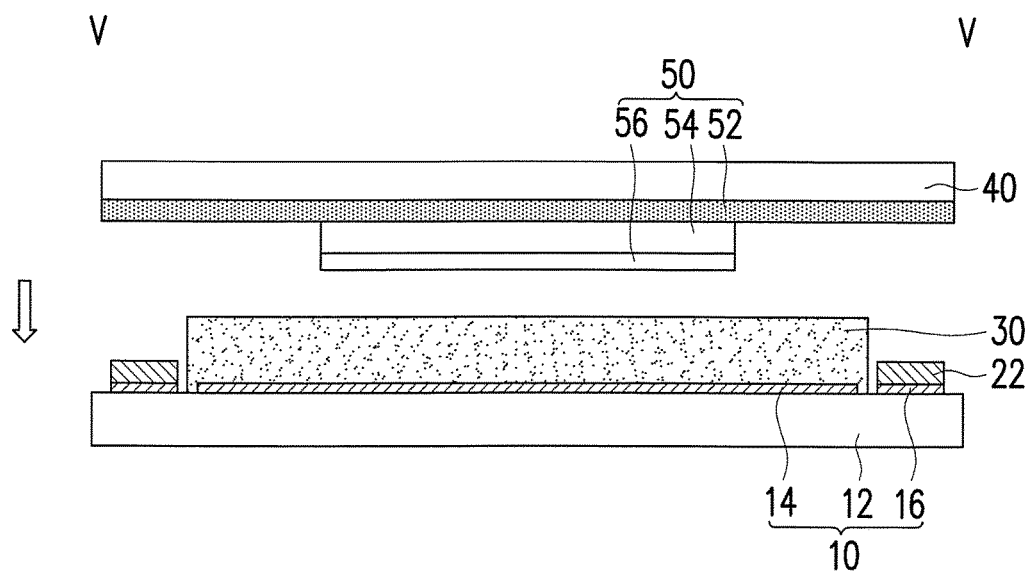
FIG. 5B schematically shows a cross section taken along line V-V in FIG. 5A.

FIG. 5A schematically illustrates a step of fabricating an illumination device according to one embodiment of the disclosure and FIG. 5B schematically shows a cross section taken along line V-V in FIG. 5A. Referring to FIG. 5A and FIG. 5B, the laminating board 10 is attached to a substrate 40 via the conductors 22 and the sealant 30 while the sealant 30 is located between the laminating board 10 and the substrate 40. In the present embodiment, a light emitting structure 50 has been formed on the substrate 40 before attaching the laminating board 10 to the substrate 40 and the light emitting structure 50 includes a first electrode layer 52, a light emitting layer 54 and a second electrode layer 56 sequentially stacked on the substrate 40. In an alternative embodiment, for attaching the laminating board 10 to the substrate 40, the sealant 30 can be formed on the substrate 40 prior to the attaching step so that the step of FIG. 4A and 4B are merely an example which form no limit to the disclosure.

A material of the light emitting layer 54 includes organic light emitting material so that the light emitting structure 50 is an organic light emitting structure. In addition, a material of the first electrode layer 52 includes transparent conductive material and a material of the second electrode layer 56 can be a conductive material having required conductivity. The thickness of the first electrode layer 52 can be 150 nm to 300 nm, a thickness of the second electrode layer 56 can be 100 nm and the thickness of the light emitting layer 54 can be 100 nm to 200 nm. Therefore, the total thickness of the light emitting structure 50 can be about 600 nm or less and the drawings in the disclosure schematically show the light emitting structure 50 in an overstated scale for illustration.

Figure 6A:
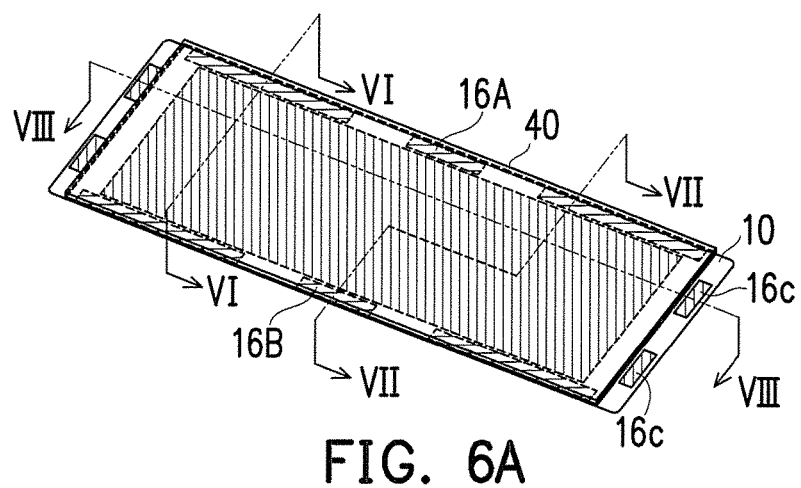
FIG. 6A schematically illustrates an illumination device according to one embodiment of the disclosure.
Figure 6B:
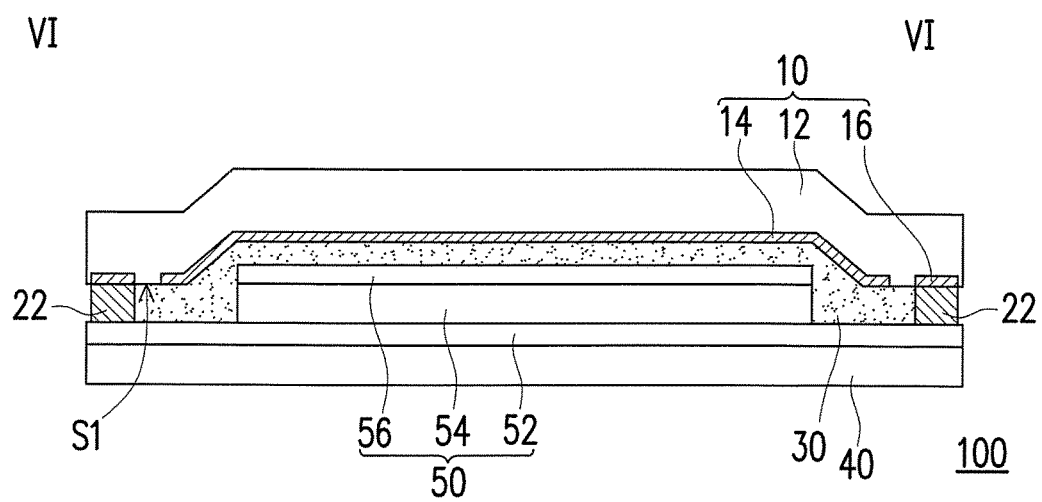
FIG. 6B schematically shows a cross section taken along line VI-VI in FIG. 6A.

The sealant 30 is not cured and is soft during laminating the laminating board 10 to the substrate 40 so that the light emitting structure 50 can be pressed and embedded into the sealant 30. Therefore, as shown in FIGS. 6A and 6B which schematically illustrate an illumination device according to one embodiment, the light emitting structure 50 can be covered and encapsulated by the sealant 30 between the substrate 40 and the laminating board 10, and the metal layer 14 shields the area of the light emitting layer 54 of the light emitting structure 50. In the present embodiment, the conductors 22 have the adhesive property so that the laminating board 10 can be attached to the substrate 40 by pressing the region disposed with the conductors 22 under a temperature lower than 80° C. As such, the attaching step would not damage the light emitting layer 54 sensitive to high temperature, which helps improving the yield rate of the fabrication.

In addition, after attaching the laminating board 10 to the substrate 40, a curing process, such as a photo curing process, can be performed to cure the sealant 30 and thus an illumination device 100 can be formed. In one embodiment, the cured sealant 30 can have a thickness of 20 μm to 30 μm. In FIG. 6A and FIG. 6B, the illumination device 100 includes the substrate 40, the light emitting structure 50, the sealant 30 and the laminating board 10, in which the laminating board 10 is attached to the substrate 40 via the conductors 22. The laminating board 10 includes the metal layer 14 and the pads 16 exposed at a first surface S1 of the carrier body 12, wherein the metal layer 14 and the pads 16 are electrically and physically isolated from each other. The light emitting structure 50 includes the first electrode layer 52, the light emitting layer 54 and the second electrode layer 56 stacked on the substrate 40 in sequence and the first electrode layer 52 and the second electrode layer 56 can be electrically connected to the pads 16 of the laminating board 10 via the corresponding conductors 22.

Figure 6C:
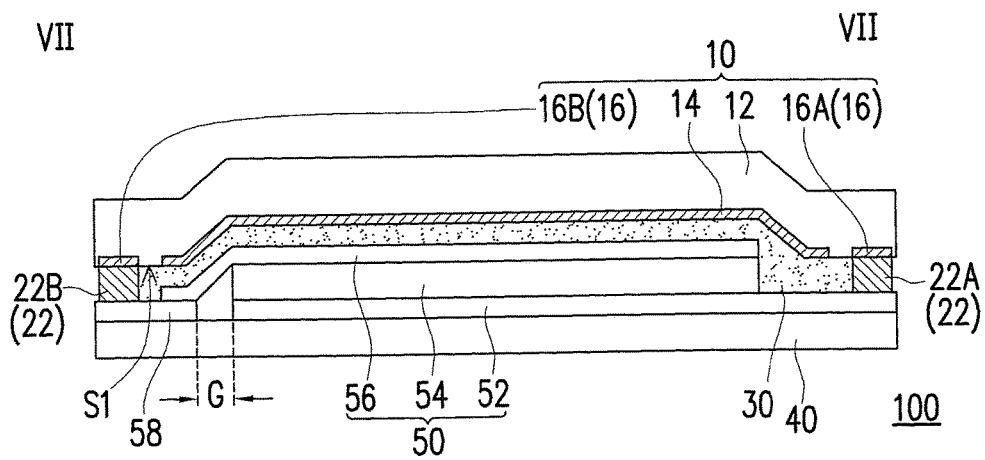
FIG. 6C schematically shows a cross section taken along line VII-VII in FIG. 6A.

FIG. 6C schematically shows a cross section taken along line VII-VII in FIG. 6A. Referring to FIG. 6C, in the present embodiment, the light emitting structure 50 further includes a connecting electrode 58 formed by a film layer of the first electrode layer 52, and the connecting electrode 58 is separated from the first electrode layer 52 by a gap G which can be greater than 3 mm or more so that the connecting electrode 58 and the first electrode layer 52 are electrically independent from each other. The second electrode layer 56 exceeds the area of the light emitting layer 54 and contacts the connecting electrode 58, such that the second electrode layer 56 is electrically connected to the connecting electrode 58 on the same layer of the first electrode layer 52 while the first electrode layer 52 and the second electrode layer 56 are electrically independent from each other. In addition, the pads 16 formed in the laminating board 10 may include a first pad 16A and a second pad 16B electrically independent from the first pad 16A, and the conductors 22 may include a first conductor 22A and a second conductor 22B electrically independent from the first conductor 22A. The first conductor 22A is in contact with and electrically connected to the first electrode layer 52 and the first pad 16A. The second conductor 22B is in contact with and electrically connected to the connecting electrode 58 and the second pad 16B. Accordingly, the first electrode layer 52 is electrically connected to the first pad 16A through the first conductor 22A and the second electrode layer 56 is electrically connected to the second pad 16B through the connecting electrode 58 and the second conductor 22B in sequence.

The material of the light emitting layer 54 includes organic light emitting material and may be deteriorated by gas and water penetrating the laminating board 10 from the external environment. Therefore, the sealant 30 covers the light emitting structure 50 and contacts the metal layer 14, and the metal layer 14 shields the area of the light emitting layer 54 of the light emitting structure 50, such that the sealant 30 and the metal layer 14 together encapsulate the light emitting structure 50 and the metal layer 14 serves as a barrier capable of preventing from the penetration of the external gas and water. As shown in FIGS. 6B and 6C, an area of the metal layer 14 is larger than the area of the light emitting layer 54, so that the metal layer 14 can complete shield the area of the light emitting layer 54 to provide a complete shielding effect. Accordingly, the light emitting layer 54 would not be deteriorated by the penetrated gas and water, which helps elongating the lifetime of the illumination device 100.

In the present embodiment, the metal layer 14 and the pads 16 are formed in the laminating board 10, wherein the pads 16 provide the electrical conduction effect and the metal layer 14 provides the gas-water blocking effect. Therefore, the laminating board 10 of the illumination device 100 can serve as a circuit board as well as a gas-water barrier, which simplifies the fabrication and the structure design of the illumination device 100. Specifically, during the step of attaching the laminating board 10 to the substrate 40, the metal layer 14 and the pads 16 are connected and aligned to the predetermined positions so that there is no need to perform respective alignment steps for connecting the metal layer 14 and the pads 16 on correct positions. Accordingly, the misalignment issue of fabricating the illumination device 100 can be mitigated.

Figure 6D:
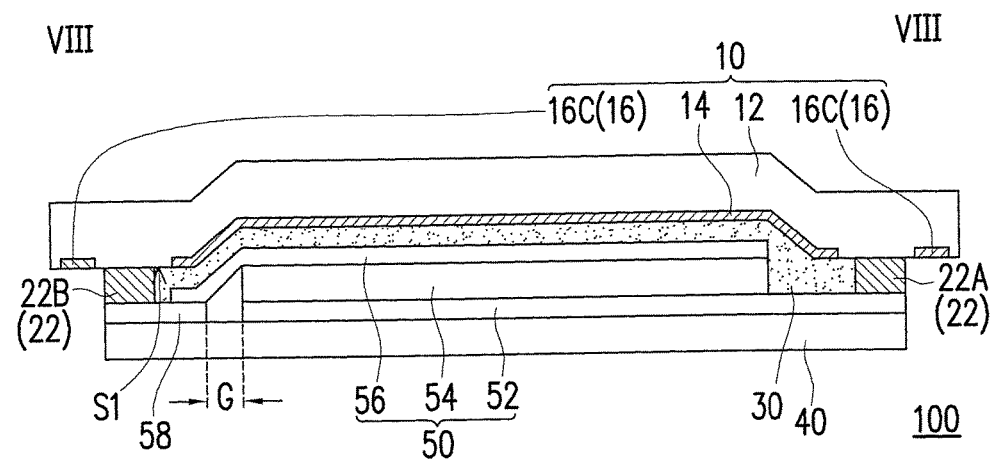
FIG. 6D schematically shows a cross section taken along line VIII-VIII in FIG. 6A.

FIG. 6D schematically shows a cross section taken along line VIII-VIII in FIG. 6A. Referring to FIG. 6D, the pads 16 of the laminating board 10 can further includes outer contact pad 16C which is exposed by the area of the substrate 40. In the present embodiment, the laminating board 10 has an area greater than the substrate 40, such that the outer contact pads 16C can be exposed after the laminating board 10 is attached to the substrate 40 for connecting with an outer circuit. In addition, the outer contact pads 16C can include at least one electrically connected to the first electrode layer 52 of the light emitting structure 50 and at least another one electrically connected to the second electrode layer 56 of the light emitting structure 50. In an embodiment, the laminating board 10 can include a plurality of conductive layers embedded therein and different conductive layers are separated by one insulation layer. In addition, contact vias passing through the insulation layer can be formed in the laminating board for electrically connecting different conductive layers for achieving a desired electric connection. Namely, the laminating board 10 can be a multi-layer wiring board.

Figure 6E:
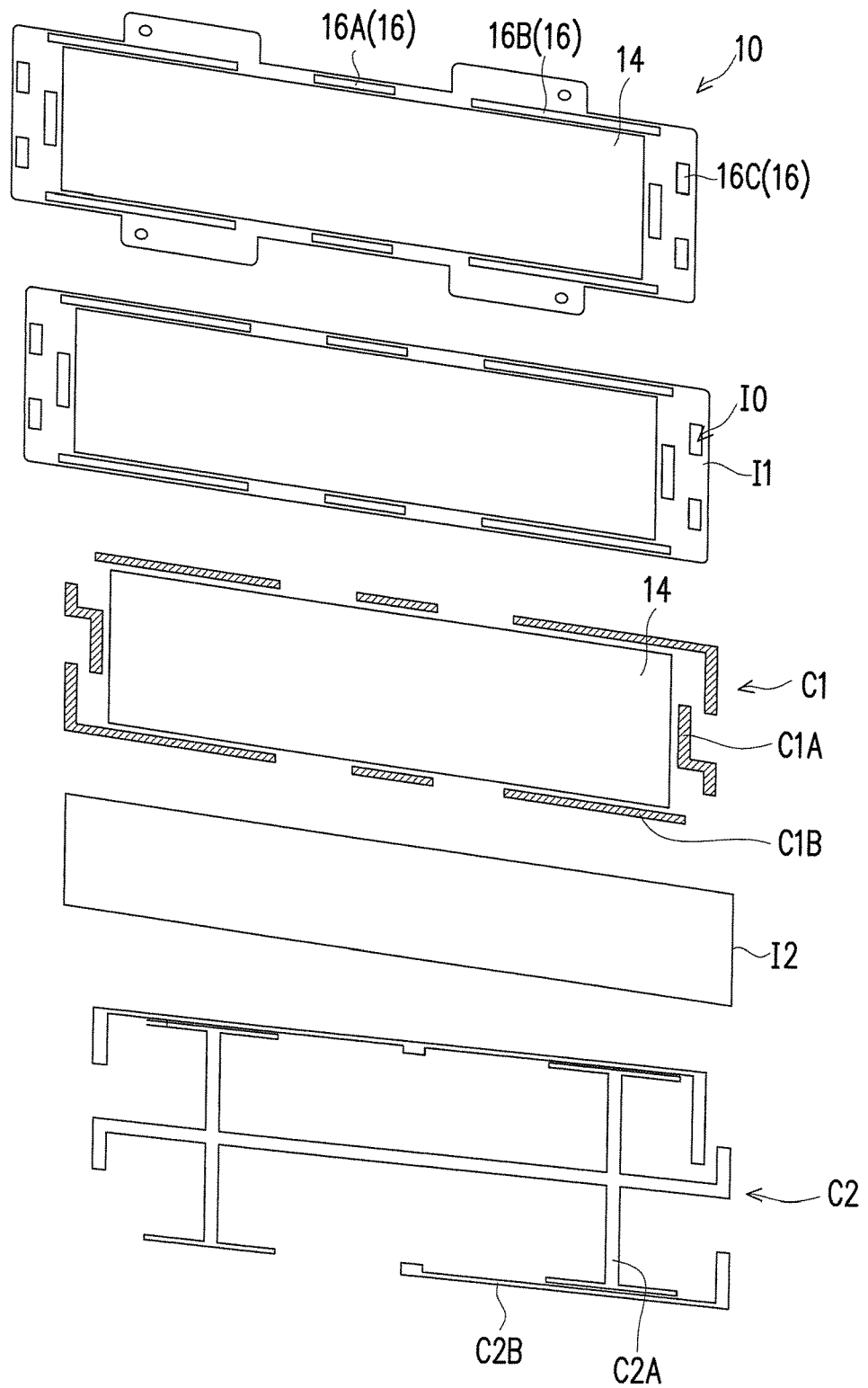
FIG. 6E schematically illustrates the conductive layers in the laminating board according to one embodiment.

FIG. 6E schematically illustrates the conductive layers in the laminating board according to one embodiment. Referring to FIG. 6E, the laminating board 10 includes at least the first conductive layer C1, the second conductive layer C2, and the insulation layers I1 and I2. The insulation layer I1 has a plurality of openings IO exposing a portion of the first conductive layer C1 to define the pads 16 and the conductive layer 14. The insulation layer I2 is disposed between the first conductive layer C1 and the second conductive layer C2.

The first conductive layer C1 includes the first conductor portion C1A and the second conductor portion C1B that are electrically independent from each other. For example, the first conductor portion C1A can define the first pad 16A and the second conductor portion C1B can define the second pad 16B and thus the first conductor portion C1A and the second conductor portion C1B are respectively electrically connected to the first electrode layer 52 and the second electrode layer 56 of the light emitting structure 50 when the laminating board 10 is attached to the substrate 40 as shown in FIG. 6A.

As shown in FIG. 6E, the first conductor portion C1A may include a plurality of patterns separated from each other and the second conductor portion C1B may include a plurality of patterns separated from each other. The second conductive layer C2 can include a third conductor portion C2A for connecting the separating patterns of the first conductor portion C1A and a fourth conductor portion C2B for connecting the separating patterns of the second conductor portion C1B. Specifically, the first conductor portion C1A in the first conductive layer C1 can be connected to the third conductor portion C2A through a plurality of conductive vias (not shown) passing through the insulation layer I2 for constructing a continuous conductive path. Similarly, the second conductor portion C1B in the first conductive layer C1 can be connected to the fourth conductor portion C2B through other conductive vias (not shown) passing through the insulation layer I2 for constructing a continuous conductive path. However, the pattern design of the conductive layers is not limited as described above.

Figure 6F:
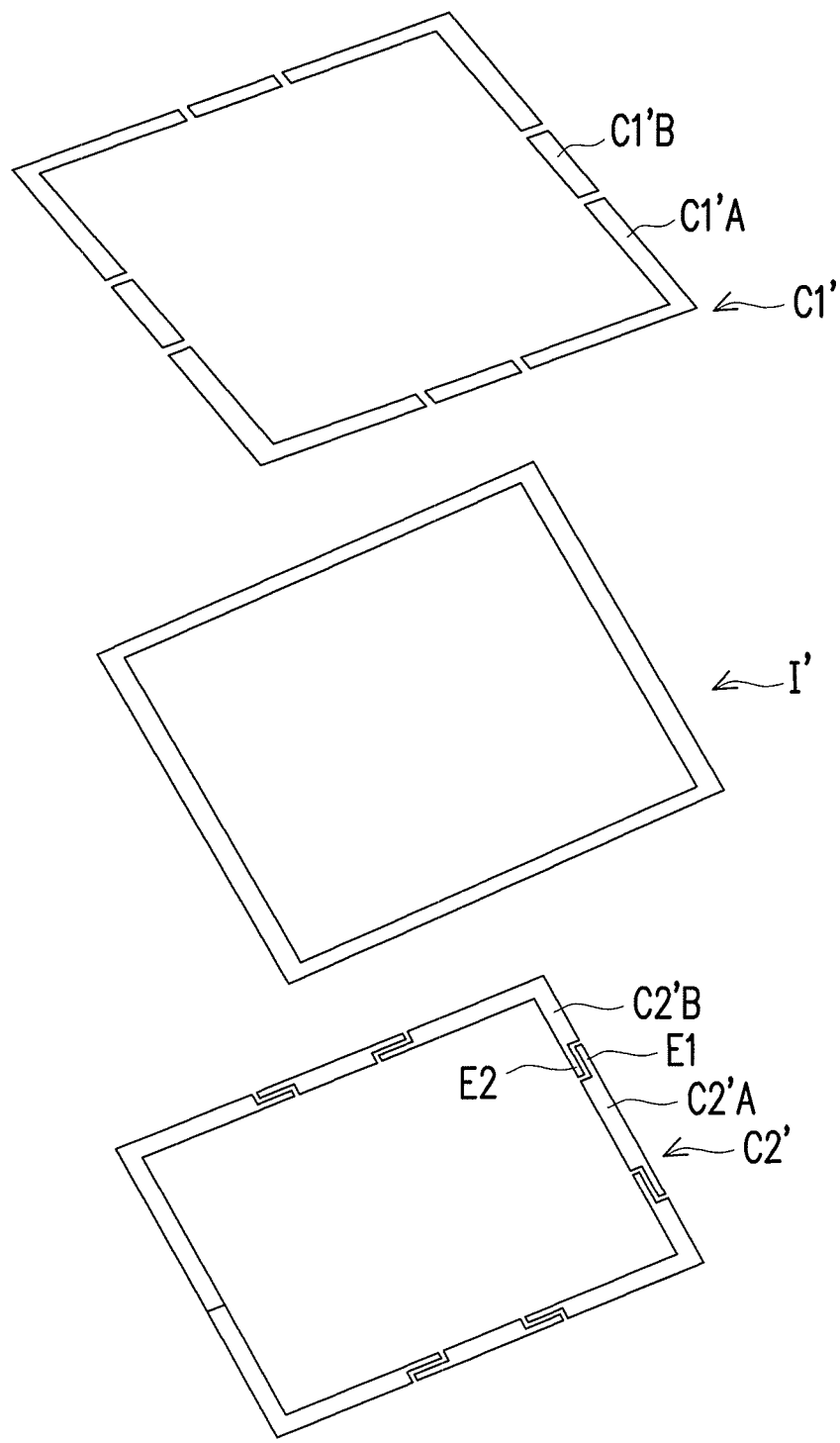
FIG. 6F illustrates the pattern design of the conductive layers in the laminating board according to another embodiment.

FIG. 6F illustrates the pattern design of the conductive layers in the laminating board according to another embodiment. In FIG. 6F, the first conductive layer C1' includes a first conductor portion C1'A and a second conductor portion C1'B. The patterns of the first conductor portion C1'A are located between the corners and the pattern of the second conductor portion C1'B are located to the corners, in which the patterns of the first conductor portion C1'A and the patterns of the second conductor portion C1'B are alternatively arranged to form a ring shape layout. The second conductive layer C2' includes the third conductor portion C2'A and the fourth conductor portion C2'B. The first conductive layer C1' and the second conductive layer C2' are isolated by the insulation layer I' having a ring-like shape. The patterns of the third conductor portion C2'A are located between the corners and the pattern of the fourth conductor portion C2'B are located to the corners, in which each pattern of the third conductor portion C2'A has an extending branch E1 at each terminal and each pattern of the fourth conductor portion C2'B has an extending branch E2 at each terminal. The area of the extending branch E1 can overlap the area of the first conductor portion C1'A and the area of the extending branch E2 can overlap the area of the second conductor portion C1'B, which forms a continuous conductive path by the first conductor portion C1'A and the third conductor portion C2'A and forms another continuous conductive path by the second conductor portion C1'B and the fourth conductor portion C2'B.

Figure 6G:
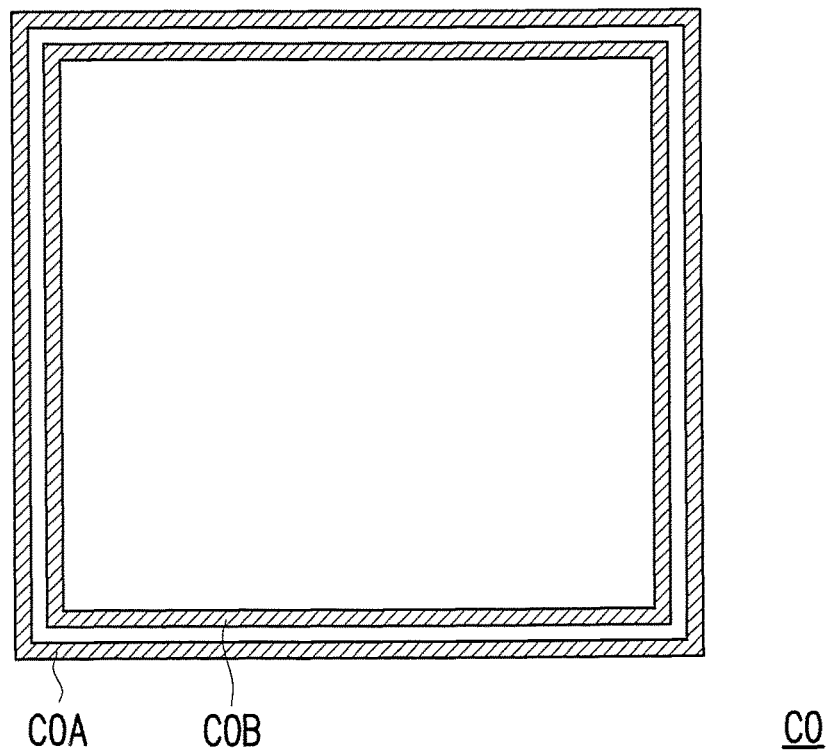
FIG. 6G illustrates the pattern design of the conductive layers in the laminating board according to another embodiment.

FIG. 6G illustrates the pattern design of the conductive layers in the laminating board according to another embodiment. In FIG. 6G, only one conductive layer C0 is formed in the laminating board, and the conductive layer C0 includes the first conductor portion C0A and the second conductor portion C0B independent from each other. In FIG. 6G, the first conductor portion C0A has a ring shape and the second conductor portion C0B has a ring shape in the inner side of the ring shape of the first conductor portion C0A.

Figure 7:
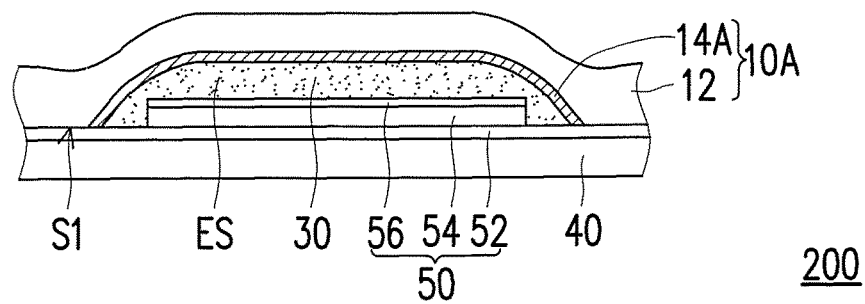
FIG. 7 schematically illustrates a portion of an illumination device according to another embodiment of the disclosure.

FIG. 7 schematically illustrates a portion of an illumination device according to another embodiment of the disclosure. Referring to FIG. 7, an illumination device 200 includes a substrate 40, a light emitting structure 50, a sealant 30, and a laminating board 10A. The light emitting structure 50, similar to the embodiment of FIG. 6A and FIG. 6B, includes a first electrode layer 52, a light emitting layer 54 and a second electrode 56 stacked on the substrate 40 in sequence. The sealant 30 is disposed on the substrate 40 and covers the light emitting structure 50. The laminating board 10A is attached to the substrate 40. The sealant 30 is located between the laminating board 10A and the substrate 40. The laminating board 10A includes a carrier body 12, a metal layer 14A and a plurality of pads (not shown but can refer to the pads 16 in FIG. 6B). The metal layer 14A is exposed at a first surface S1 of the carrier body 12, is in contact with the sealant 30 and shields an area of the light emitting layer 54 of the light emitting structure 50.

In the present embodiment, the metal layer 14A of the laminating board 10A is curved to form an encapsulating space ES between the substrate 40 and the metal layer 14A and the light emitting layer 54 of the light emitting structure 50 is completely encapsulated in the encapsulating space ES. Accordingly, the curved metal layer 14A can provide the side barrier effect avoiding the penetration of the external gas and water at the side direction. In the present embodiment, the fabrication of the illumination device 200 can be similar to the illumination device 100 and is not reiterated here.

Figure 8A:
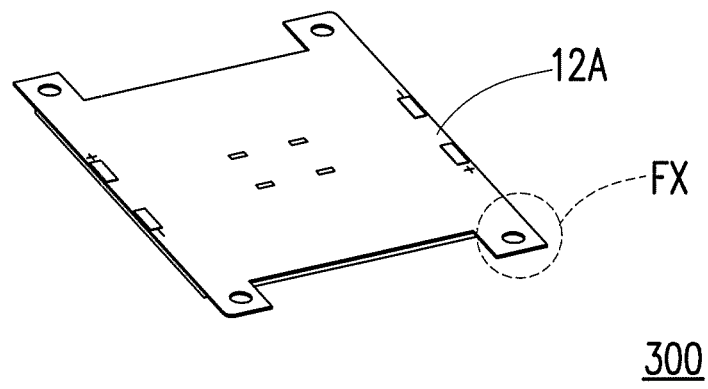
FIG. 8A schematically illustrates an illumination device according to another embodiment of the disclosure.
Figure 8B:
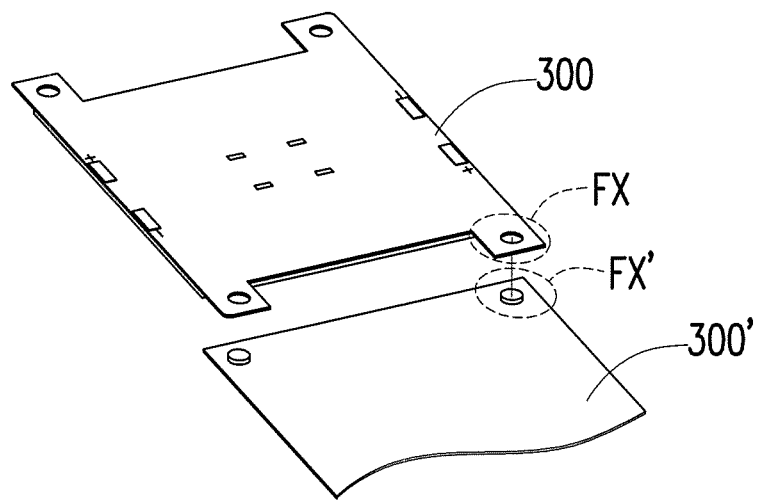
FIG. 8B schematically illustrates two illumination devices connected through the fixing structure according to an embodiment.

FIG. 8A schematically illustrates an illumination device according to another embodiment of the disclosure. Referring to FIG. 8A, the illumination device 300 can be modified from any of the illumination device 100 and the illumination device 200. Specifically, the illumination device 300 is different to above illumination devices 100 to 200 in that the carrier body 12A of the laminating board 10A further has at least one fixing structure FX for securing the illumination device 300 to an external object such as another illumination device, a lamp cover, a support board, a lamp device, etc. The fixing structure FX can be the extending portions at corners and each extending portion has a hole for securing. In an alternate embodiment, the fixing structure FX can be protrusions. For example, FIG. 8B schematically illustrates two illumination devices connected through the fixing structure according to an embodiment. The illumination device 300 having the fixing structure FX as the extending portions at corners and the illumination device 300' having the fixing structure FX' as the protrusions are connected to each other by inserting the fixing structure FX' into the holes of the fixing structures FX.

Figure 9:
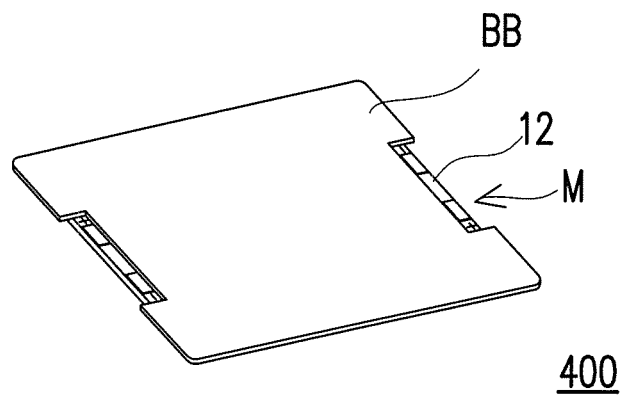
FIG. 9 schematically illustrates an illumination device according to another embodiment of the disclosure.

FIG. 9 schematically illustrates an illumination device according to another embodiment of the disclosure. Referring to FIG. 9, the illumination device 400 includes a main body M and a back board BB attached to the main body M, wherein the main body M can be selected from any of the illumination device 100, the illumination device 200 and the illumination device 300. Specifically, the back board BB can be a heat dissipating board attached to the laminating board 12 of the main body M, so that the back board BB helps the heat dissipation.

Figure 10:
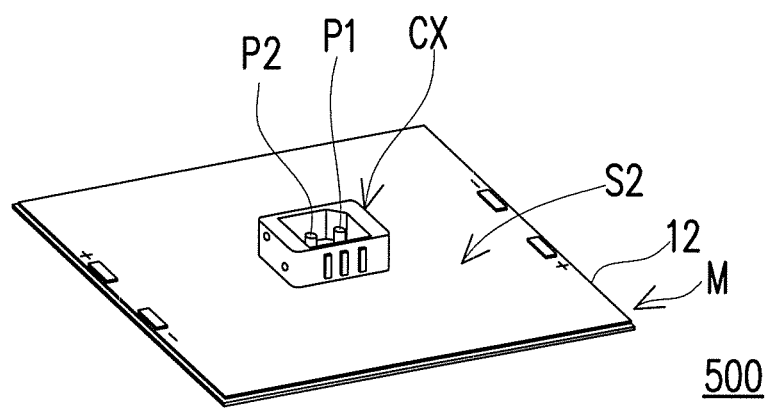
FIG. 10 schematically illustrates an illumination device according to another embodiment of the disclosure.

FIG. 10 schematically illustrates an illumination device according to another embodiment of the disclosure. Referring to FIG. 10, the illumination device 500 includes a main body M and a connector CX, wherein the main body M can be selected from any of the illumination device 100, the illumination device 200 and the illumination device 300. For example, when the main body M is the illumination device 100 in FIG. 6B the main body M includes a carrier body 12. As such, the connector CX is disposed on the second surface S2 of the carrier body 12 and the second surface S2 of the carrier body 12 is opposite to the first surface S1 of the carrier body 12 as shown in FIG. 6B. In addition, the connector CX can include a first contact portion P1 and a second contact portion P2. When the main body M is the illumination device 100, the illumination device 200 or the illumination device 300, the first contact portion P1 and the second contact portion P2 can be electrically connected to the first electrode layer 52 and the second electrode layer 56 respectively. When the main body M is the illumination device 300, the first contact portion P1 and the second contact portion P2 can be electrically connected to the first electrode layer 52 and the second electrode layer 56 respectively.

Figure 11A:
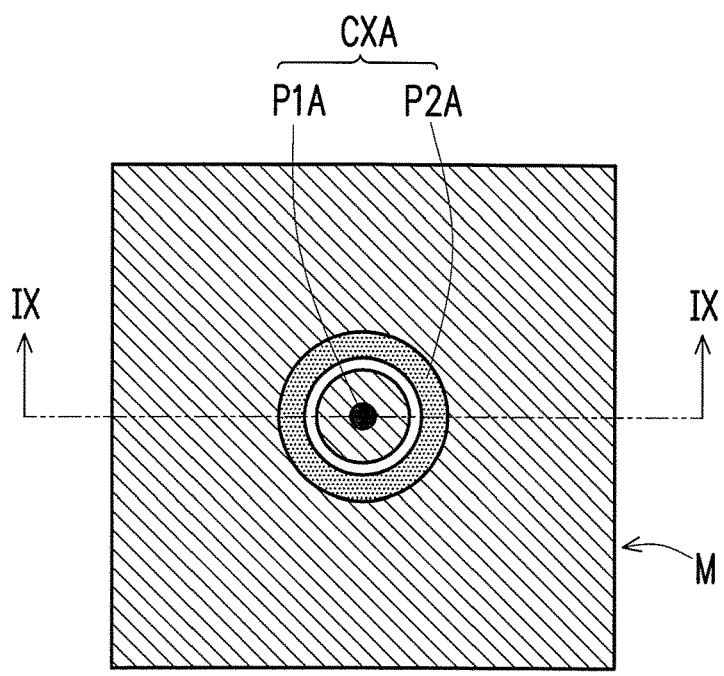
FIG. 11A schematically illustrates a connector of an illumination device according to an embodiment of the disclosure.
Figure 11B:
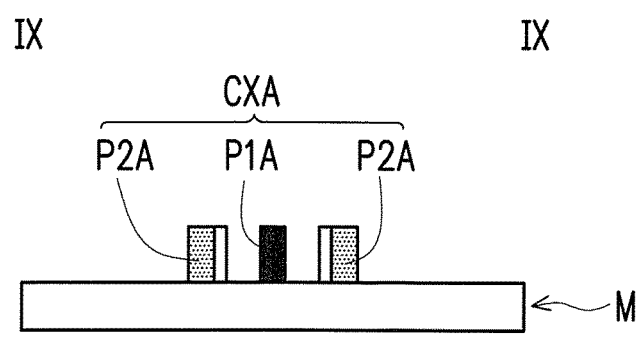
FIG. 11B schematically illustrates a cross section taken along line IX-IX of FIG. 11A.

FIG. 11A schematically illustrates a connector of an illumination device according to an embodiment of the disclosure and FIG. 11B schematically illustrates a cross section taken along line IX-IX of FIG. 11A. Referring to FIG. 11A and FIG. 11B, a connector CXA disposed on a main body M of an illumination device includes a first contact portion P1A and a second contact portion P2A, wherein the first contact portion P1A is a pin and the second contact portion P2A is a ring surrounding the pin of the first contact portion P1A. The second contact portion P2A may be a hollow ring wall having a positive electrode disposed at the inner periphery, and an insulating material disposed at the outer periphery. The first contact portion P1A may be a metallic cylinder structure that may be used as a negative electrode. However, the polarities of the first contact portion P1A and the second contact portion P2A may be reversed. The connector CXA functions as an electrical terminal to be further connected to the driver or power source. Also, the connector CXA may function as a fixture for physically fixing the illumination device to a support through a mating mechanism. In this embodiment, the second contact portion P2A is hollow-circular-ring shaped, and the first contact portion P1A is cylindrical shaped. However, the shapes of the ring portion and/or the pin are not limited by the figures. For example, the ring portion may be hollow or semi-hollow and the shape thereof may be triangular, square, rhombus or any polygonal shape.

Figure 12A:
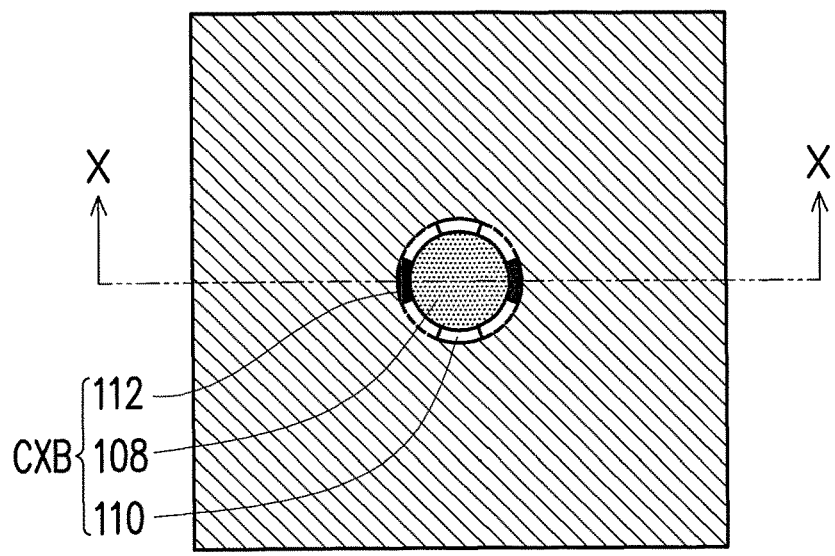
FIG. 12A schematically illustrates a connector of an illumination device according to an embodiment of the disclosure.
Figure 12B:
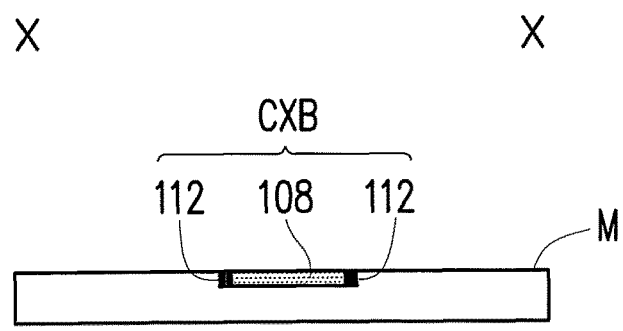
FIG. 12B schematically illustrates a cross section taken along line X-X of FIG. 12A.

FIG. 12A schematically illustrates a connector of an illumination device according to an embodiment of the disclosure and FIG. 12B schematically illustrates a cross section taken along line X-X of FIG. 12A. Referring to FIG. 12A and FIG. 12B, a connector CXB is disposed on a main body M of an illumination device. The connector CXB includes a circular magnetic structure 108, positive electrodes 110 and negative electrodes 112. The positive and negative electrodes 110 and 112 respectively providing the function of the first contact portion P1A and a second contact portion P2A in the above embodiment are alternately arranged and separately from one another and surrounding the circular magnetic structure 108 in the middle. In FIG. 12B, the connector CXB, including the circular magnetic structure 108 and the positive and negative electrodes 110 and 112, is inlaid in the main body M. It is to be noted that the magnetic structure 108 is not limited to the circular shape as described in the disclosure.

In view of the above, an illumination device according to an embodiment of the disclosure includes a laminating board having the metal layer for blocking the external gas and water and the pads for electrically connecting to the electrode layer of the light emitting structure. Therefore, the illumination device according to an embodiment of the disclosure requires no separating fabricating steps for achieve the electrical connection of the light emitting structure and the water-gas blocking of the light emitting structure, which simplifies the fabrication method and reduce the fabrication cost and fabrication time.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims and their equivalents.

What is claimed is:
1. An illumination device comprising:
a substrate;
a light emitting structure including a first electrode layer, a light emitting layer, and a second electrode layer, wherein the first electrode layer, the light emitting layer and the second electrode layer are stacked on the substrate in sequence;
a sealant being disposed on the substrate and covering the light emitting structure; and
a laminating board attached to the substrate and the sealant being located between the laminating board and the substrate, wherein the laminating board comprises:
a carrier body;
a first conductive layer, disposed on the carrier body and comprising:
a metal layer exposed at a first surface of the carrier body, in contact with the sealant and shielding an area of the light emitting layer of the light emitting structure; and
a plurality of pads exposed at the first surface of the carrier body and electrically connected to the first electrode layer and the second electrode layer, wherein the metal layer is electrically isolated from the plurality of pads, and the plurality of pads are exposed by the sealant;
a first insulation layer, disposed between the first conductive layer and the sealant and having a central opening exposing the metal layer and a plurality of peripheral openings exposing the plurality of pads, wherein the peripheral openings surround the central opening;
a second conductive layer, the first conductive layer being disposed between the second conductive layer and the sealant, wherein the plurality of pads comprise first pads and second pads, the second conductive layer comprises a first conductor portion connecting between two of the first pads and a second conductor portion connecting between two of the second pads, a trace of the first conductor portion passes through an area of the metal layer, and a trace of the second conductor portion is located at an outer side of the first conductor portion; and
a second insulation layer disposed between the first conductive layer and the second conductive layer.

2. The illumination device according to claim 1, wherein an area of the metal layer is larger than the area of the light emitting layer.

3. The illumination device according to claim 1, wherein the metal layer of the laminating board is curved to form an encapsulating space between the substrate and the metal layer and the light emitting layer of the light emitting structure is completely encapsulated in the encapsulating space.

4. The illumination device according to claim 1, further comprising a plurality of conductors connecting the plurality of pads to the first electrode layer and the second electrode layer.

5. The illumination device according to claim 4, wherein the conductors are made of conductive adhesive material.

6. The illumination device according to claim 1, further comprising a connector disposed on a second surface of the carrier body, wherein the second surface of the carrier body is opposite to the first surface of the carrier body and the connector is electrically connected to the first electrode layer and the second electrode layer.

7. The illumination device according to claim 6, wherein the connector comprises a first contact portion electrically connected to the first electrode layer and a second contact portion electrically connected to the second electrode layer.

8. The illumination device according to claim 7, wherein the connector further comprises a magnetic structure, the first contact portion and the second contact portion near the magnetic structure.

9. The illumination device according to claim 1, wherein a material of the light emitting layer comprises an organic light emitting material.

10. The illumination device according to claim 1, wherein the light emitting structure further comprises a connecting electrode formed by a layer of the first electrode layer, the connecting electrode is separated from the first electrode layer by a gap and the second electrode layer exceeds the area of the light emitting layer and contacts the connecting electrode.

11. The illumination device according to claim 1, wherein the plurality of pads further comprise a plurality of outer contact pads exposed by the substrate, at least one of the outer contact pads is electrically connected to the first electrode layer, and at least another one of the outer contact pads is electrically connected to the second electrode layer.

12. The illumination device according to claim 1, wherein the carrier body comprises at least one fixing structure for securing the illumination device to an external object, wherein electrical signal transmission paths of the first electrode layer and the second electrode layer are independent from the fixing structure.

13. A method of fabricating an illumination device, comprising:
providing a laminating board, wherein the laminating board comprises a carrier body, a first conductive layer comprising a metal layer and a plurality of pads, a first insulation layer, a second conductive layer and a second insulation layer, and the plurality of pads are electrically isolated from the metal layer; and
laminating the laminating board to a substrate by a sealant being located between the laminating board and the substrate, and the sealant being in contact with the metal layer, wherein
a light emitting structure comprises a first electrode layer, a light emitting layer and a second electrode layer, the first electrode layer, the light emitting layer and the second electrode layer are sequentially stacked on the substrate, the light emitting structure is encapsulated between the substrate and the laminating board, the sealant covers the light emitting structure, the plurality of pads are exposed by the sealant, the metal layer of the laminating board is in contact with the sealant and shields an area of the light emitting layer of the light emitting structure,
the first insulation layer is disposed between the first conductive layer and the sealant and has a central opening exposing the metal layer and a plurality of peripheral openings exposing the plurality of pads, the peripheral openings surrounding the central opening,
the first conductive layer is disposed between the second conductive layer and the sealant, the plurality of pads comprise first pads and second pads, the second conductive layer comprises a first conductor portion connecting between two of the first pads and a second conductor portion connecting between two of the second pads, a trace of the first conductor portion passes through an area of the metal layer, a trace of the second conductor portion is located at an outer side of the first conductor portion, and a second insulation layer is disposed between the first conductive layer and the second conductive layer.

14. The method of fabricating the illumination device according to claim 13, wherein the laminating board is laminated to the substrate at a temperature lower than 80° C.

15. The method of fabricating the illumination device according to claim 13, wherein the metal layer of the laminating board is curved during laminating the laminating board to the substrate to form an encapsulating space between the substrate and the metal layer, and the light emitting layer of the light emitting structure is completely encapsulated in the encapsulating space.

16. The method of fabricating the illumination device according to claim 13, further forming a plurality of conductors on the laminating board before laminating the laminating board to the substrate, wherein the conductors are connected to the plurality of pads.

17. The method of fabricating the illumination device according to claim 16, wherein the laminating board is laminated to the substrate by connecting the conductors to at least one of the first electrode layer and the second electrode layer of the light emitting structure and pressing the light emitting structure into the sealant.

18. The method of fabricating the illumination device according to claim 16, wherein the conductors are formed on the laminating board by attaching a conductive film onto the plurality of pads of the laminating board.

19. The method of fabricating the illumination device according to claim 18, wherein the conductive film includes the conductors and a releasing layer carrying the conductors, and the releasing layer is removed prior to laminating the laminating board to the substrate.

20. The method of fabricating the illumination device according to claim 13, wherein a material of the light emitting layer comprises an organic light emitting material.

21. The method of fabricating the illumination device according to claim 13, wherein the sealant is formed on the substrate or the laminating board prior to laminating the laminating board to the substrate.

22. The method of fabricating the illumination device according to claim 13, wherein the carrier body comprises at least one fixing structure for securing the illumination device to an external object, and electrical signal transmission paths of the first electrode layer and the second electrode layer are independent from the fixing structure.

* * * * *